(12) United States Patent
Chang et al.

(10) Patent No.: US 8,716,841 B1
(45) Date of Patent: May 6, 2014

(54) PHOTOLITHOGRAPHY MASK AND PROCESS

(71) Applicant: Taiwan Semiconductor Manufacturing Company, Ltd., Hsin-Chu (TW)

(72) Inventors: Shih-Ming Chang, Zhubei (TW); Shuo-Yen Chou, Jian Shiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/831,169

(22) Filed: Mar. 14, 2013

(51) Int. Cl.
*G03F 1/00* (2012.01)

(52) U.S. Cl.
USPC .............................. 257/632; 438/637; 438/629

(58) Field of Classification Search
USPC ................... 257/632; 438/637, 629, 668, 774; 430/5, 30; 716/19
See application file for complete search history.

(56) References Cited

U.S. PATENT DOCUMENTS

| | | | | |
|---|---|---|---|---|
| 6,660,462 B1 * | 12/2003 | Fukuda | | 430/394 |
| 6,759,328 B2 * | 7/2004 | Wu | | 438/652 |
| 6,818,389 B2 * | 11/2004 | Fritze et al. | | 430/5 |
| 7,107,573 B2 * | 9/2006 | Yamazoe et al. | | 430/311 |
| 2003/0180629 A1 * | 9/2003 | Wu | | 430/5 |

* cited by examiner

*Primary Examiner* — Roy Potter
(74) *Attorney, Agent, or Firm* — Haynes and Boone, LLP

(57) ABSTRACT

A photolithography mask and method includes receiving a layout of an integrated circuit including main pattern elements, inserting an array of dummy pattern elements between and around the main pattern elements, analyzing a diffraction spectrum of at least one of the main pattern elements and the array of dummy pattern elements, and varying one or more of a first pitch between corresponding features of dummy pattern elements adjacent to each other in a first direction and a second pitch between corresponding features of dummy pattern elements adjacent to each other in a second direction based on the analyzed diffraction spectrum to form a modified array of dummy pattern elements. The diffraction spectrum of the modified array of dummy pattern elements and the main pattern elements is more diffuse than a diffraction spectrum of a corresponding array of dummy pattern elements in which neither the first nor second pitch are varied and the main pattern elements.

20 Claims, 5 Drawing Sheets

PHOTOLITHOGRAPHY MASK AND PROCESS

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of device fabrication. As device densities continue to increase and feature sizes continue to decrease, device fabrication processes must constantly adapt and improve. One such process includes the use of photolithography with a mask. During photolithography a pattern is defined on the surface of a substrate through the use of light shined through or reflected off a mask. The pattern is typically used to identify two regions on the substrate: a first region that will be exposed to a further processing step and a second region that will be protected from the same further processing step. For example, the pattern might divide the substrate into regions where material is to be deposited or not deposited. In another example, the pattern might divide the substrate into regions where material is to be etched away or should remain.

Accordingly, it would be desirable to have improved photolithography patterns and methods.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIG. 3A is a simplified diagram showing a dummy pattern according to certain embodiments of the present invention.

Figure 1A:
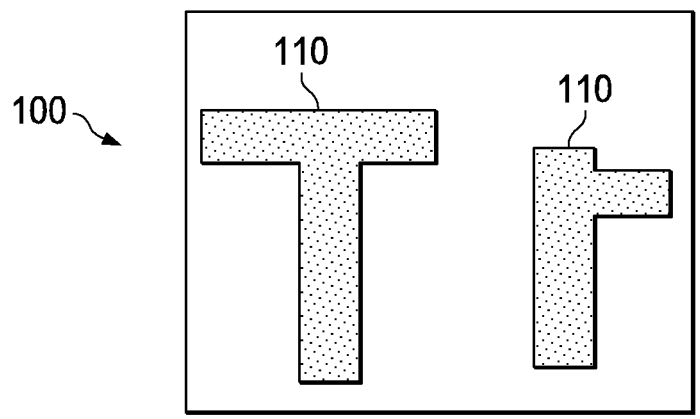
FIG. 1A shows a simplified diagram of a portion of a photolithography mask.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Various features in the figures may be arbitrarily drawn in different scales for the sake of simplicity and clarity.

Figure 1B:
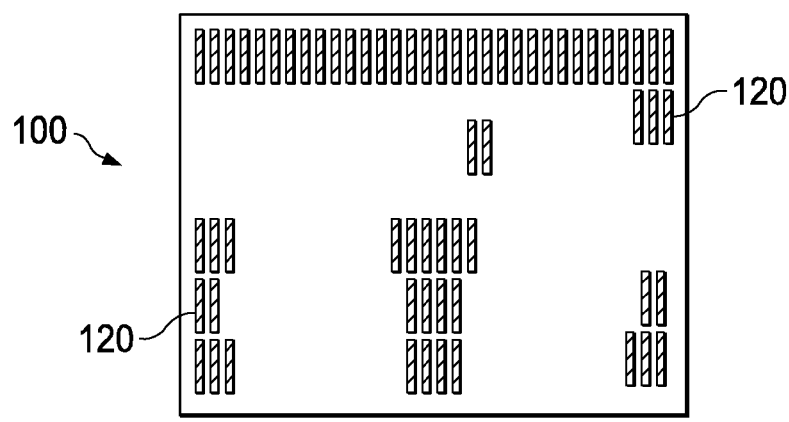
FIG. 1B shows a simplified diagram of dummy pattern elements that might be inserted into the photolithography mask.
Figure 1C:
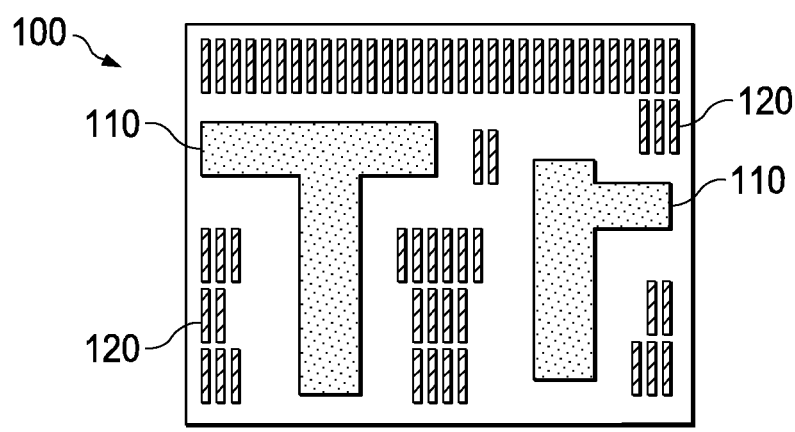
FIG. 1C shows a simplified diagram of the photolithography mask with both main pattern elements and dummy pattern elements.

FIG. 1A shows a simplified diagram of a portion of a photolithography mask 100. In many instances, a pattern defined by the photolithography mask is intended to define a pattern of materials that are a necessary part of a semiconductor circuit. Located within this photolithography mask 100 are two main pattern elements 110 that are part of the semiconductor circuit as specified by the design of the semiconductor circuit. Depending upon the material that is to be used to form the circuit elements identified by the main pattern elements 110, different deposition and follow-up process steps are typically performed. For example, some materials need to be planarized after deposition using a chemical/mechanical planarization (CMP) process. In order to improve the imaging process and/or simplify some of these later processing steps (e.g., the CMP process step) it is not uncommon to introduce additional pattern elements into the semiconductor mask 100 called dummy pattern elements 120. These dummy pattern elements 120 create additional features on the substrate that are not specified in the design of the semiconductor circuit. FIG. 1B shows a simplified diagram of dummy pattern elements 120 that might be inserted into the photolithography mask 100. As shown in FIG. 1B, the dummy pattern elements 120 include features of regular size, shape, and distribution throughout large portions of the semiconductor mask 100. FIG. 1C shows a simplified diagram of the photolithography mask 100 with both main pattern elements 110 and dummy pattern elements 120.

Figure 2A:
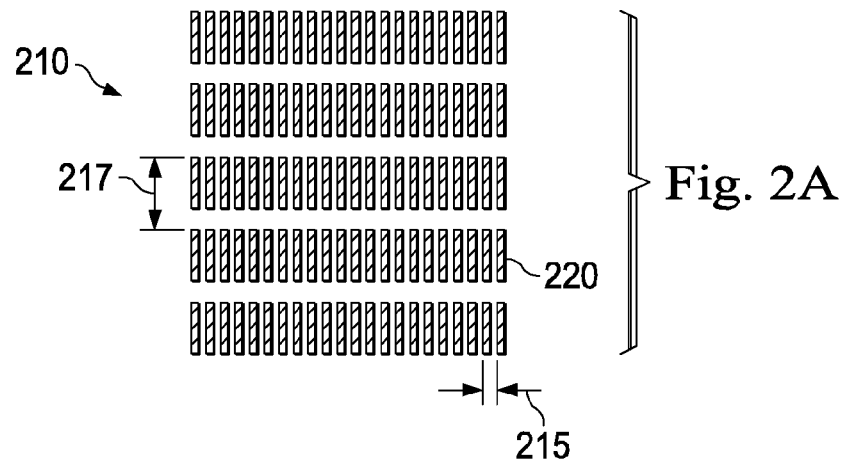
FIG. 2A is a simplified diagram showing a dummy pattern.

FIG. 2A is a simplified diagram showing a dummy pattern 210. As shown in FIG. 2A the dummy pattern 210 includes an array of dummy pattern elements 220 of uniform size and shape arranged in a regular grid of rows and columns with a uniform horizontal pitch 215 and a uniform vertical pitch 217 between corresponding features of the dummy pattern elements 220. Because of the relative magnitudes between the wavelengths of the light to be used with the dummy pattern 210 and the size and spacing of the dummy pattern elements 220, dummy pattern 210 will typically generate a diffraction spectrum with areas of strong concentrations of light and other areas with little or no light. In the case of dummy patterns with infinite periodicity, which the dummy pattern 210 approximates in a localized fashion, only the diffraction orders that satisfy the Bragg diffraction condition will result in areas of strong concentrations of light. The Bragg diffraction condition is satisfied only for discrete angles of light through the pattern mask, which results in a predictable pattern of strong concentrations of light as is well known in the art.

Figure 2B:
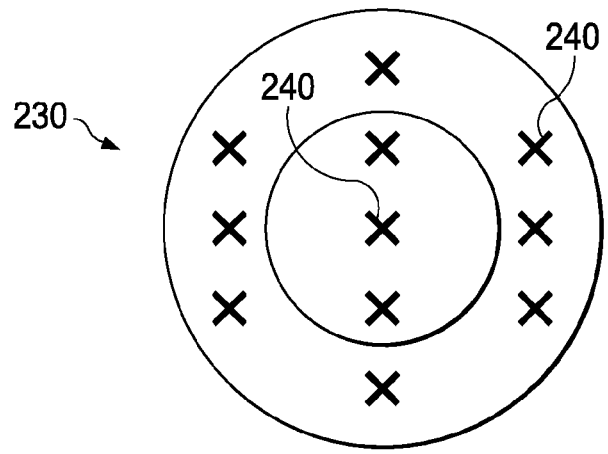
FIG. 2B is a simplified diagram showing the top view of a diffraction spectrum generated by the dummy pattern.

FIG. 2B is a simplified diagram showing the top view of a diffraction spectrum 230 generated by the dummy pattern 210. As shown in FIG. 2B, the uniform horizontal pitch 215 and the uniform vertical pitch 217 of the dummy pattern elements 220 results in several discrete regions 240 where the light through the dummy pattern 210 is significantly concentrated. Each of these discrete regions 240 is centered about locations defined by the horizontal and vertical diffraction orders that result from the periodic nature and uniform pitches between the dummy pattern elements 220.

Figure 2C:
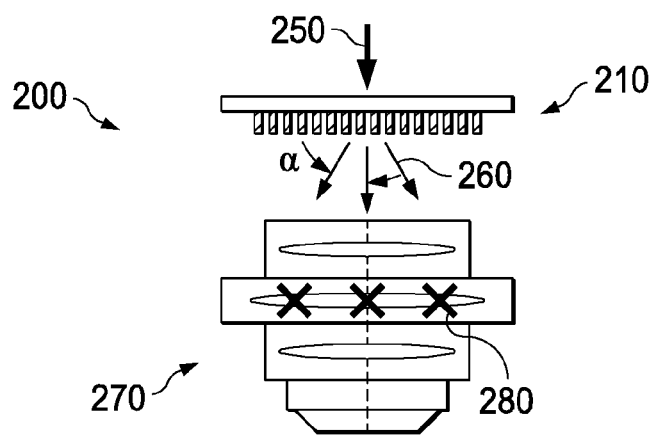
FIG. 2C is a simplified diagram showing the side view of the dummy pattern as used in an imaging system.

FIG. 2C is a simplified diagram showing the side view of the dummy pattern 210 as used in an imaging system 200. As shown in FIG. 2C, light 250 is shined at the dummy pattern 210. Due to diffraction, the light 250 passing through the dummy pattern 210 generates light rays 260 at angles α defined by the diffraction orders as shown in Equation 1, where λ is a wave length of the light rays 260. These light rays 260 can then be focused through a lens system 270. Because the light rays 260 are concentrated at specific angles α, the light rays 260 generate hot spots 280 in the lens system 270 where the light is most concentrated.

$$\alpha = \sin^{-1}\left[\frac{n\lambda}{\text{pitch}}\right]; n = \pm 1, \pm 2, \ldots \qquad \text{Eqn. 1}$$

The hot spots 280 in the lens system 270 may often become problematic. Because the hot spots 280 are regions of concentrated light, this results in a lens heating effect that causes non-uniform heating of the lens system 270, and more specifically results in regions (i.e., the hot spots 280) of the lens system 270 that are subjected to generally undesirably high temperatures. These high temperatures result in uneven wear to the lens system 270 and ultimately reduce the operational life of the lens system 270. The regions of concentrated light may also disadvantageously affect other portions of the imaging system 200.

FIG. 3A is a simplified diagram showing a dummy pattern 310 according to certain embodiments of the present invention. As shown in FIG. 3A the dummy pattern 310 includes an array of dummy pattern elements 320. Each of the dummy pattern elements 320 may generally be of uniform size and shape. Further, the dummy pattern elements 320 are arranged in rows with uniform vertical spacing or pitch 322 between each of the rows. As further shown in FIG. 3A, a first row 324 includes dummy pattern elements 320 with a first horizontal spacing or pitch, a second row 326 includes dummy pattern elements 320 with a second horizontal spacing or pitch, and a third row 328 includes dummy pattern elements 320 with a third horizontal spacing or pitch. According to some embodiments, the first horizontal pitch, the second horizontal pitch, and the third horizontal pitch vary in a distribution about a nominal horizontal pitch. In some embodiments, the distribution may vary in a range of plus or minus five percent of the nominal horizontal pitch about the nominal horizontal pitch, vary in a range of plus or minus ten percent of the nominal horizontal pitch about the nominal horizontal pitch, or even vary in excess of ten percent of the nominal horizontal pitch about the nominal horizontal pitch.

As discussed above and further emphasized here, FIG. 3A is merely an example, which should not unduly limit the scope of the claims. One of ordinary skill in the art would recognize many variations, alternatives, and modifications. According to some embodiments, the number of rows of dummy pattern elements with different horizontal pitches may include fewer or more rows than depicted in FIG. 3A. According to some embodiments, the horizontal pitch within a particular row may vary between dummy pattern elements on that row.

Figure 3B:
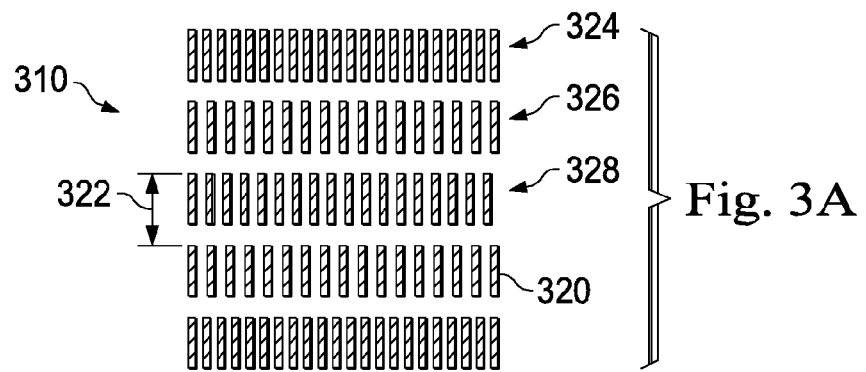
FIG. 3B is a simplified diagram showing the top view of a diffraction spectrum generated by the dummy pattern according to certain embodiments of the present invention.
Figure 3B:
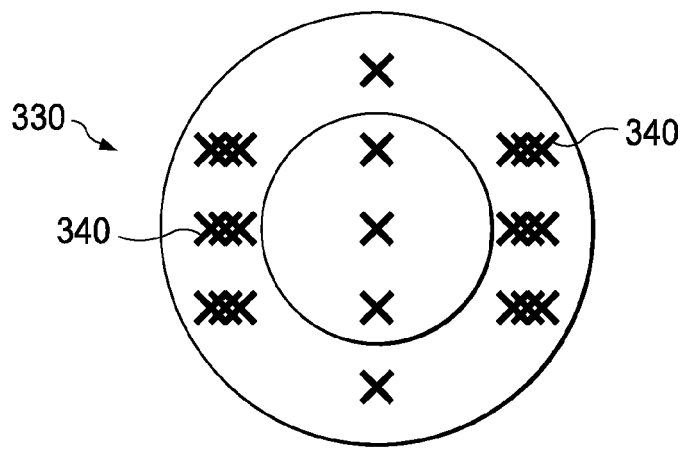

FIG. 3B is a simplified diagram showing the top view of a diffraction spectrum 330 generated by the dummy pattern 310 according to certain embodiments of the present invention. As shown in FIG. 3B, the use of different first, second, and third horizontal pitches generates a diffraction spectrum 330 different from that of FIG. 2B. The use of the different horizontal pitches results in less uniformity among the horizontal diffraction orders with the result being that the hot spots 340 located away from the vertical center line of the diffraction spectrum 330 have reduced concentrations of light and/or are diffused over a larger area.

Figure 3C:
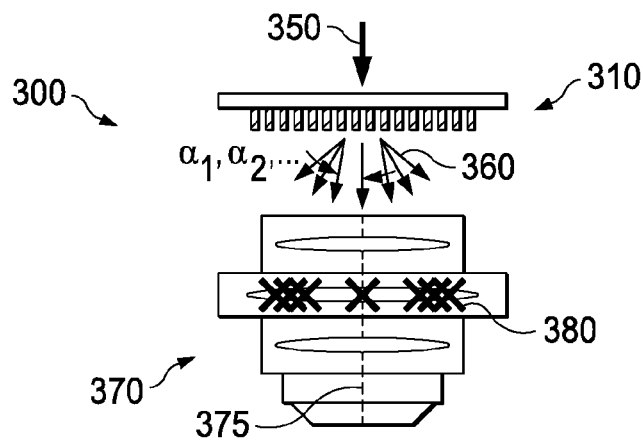
FIG. 3C is a simplified diagram showing the side view of the dummy pattern as used in an imaging system according to certain embodiments of the present invention.

FIG. 3C is a simplified diagram showing the side view of the dummy pattern 310 as used in an imaging system 300 according to certain embodiments of the present invention. As shown in FIG. 3C, light 350 is shined at the dummy pattern 310. Due to diffraction, the light 350 passing through the dummy pattern 310 generates light rays 360 at angles $\alpha_1$, $\alpha_2$, ... defined by the diffraction orders as shown in Equation 2, where λ is a wave length of the light rays 360 and $\text{pitch}_i$ represents each variation in the pitch. As Equation 2 shows, for each variation in the $\text{pitch}_i$, additional diffraction orders are generated. These light rays 360 can then be focused through a lens system 370. Because of the variations in the first, second, and third horizontal pitches, the horizontal diffraction orders are less uniform and the resulting light rays 360 are concentrated over a more diffuse range of angles $\alpha_1$, $\alpha_2$, .... This results in weaker concentrations of light and/or a more diffuse pattern in the diffraction spectrum within the lens system 370 in the hot spots 380 located away from the centerline 375 of the lens system 370. As a consequence, the lens heating effect may be reduced which may further result in an increased lifetime for the lens system 370 and the imaging system 300. In some embodiments, the use of the dummy pattern 310 may also improve the resulting image quality.

$$\alpha_i = \sin^{-1}\left[\frac{n\lambda}{\text{pitch}_i}\right]; n = \pm 1, \pm 2, \ldots \qquad \text{Eqn. 2}$$

Figure 4A:
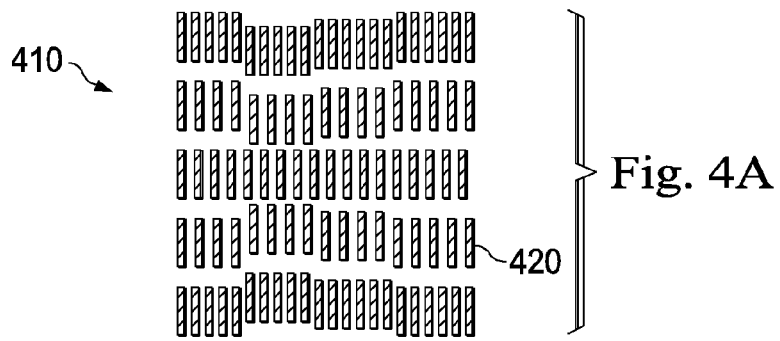
FIG. 4A is a simplified diagram showing a dummy pattern according to certain embodiments of the present invention.

FIG. 4A is a simplified diagram showing a dummy pattern 410 according to certain embodiments of the present invention. As shown in FIG. 4A the dummy pattern 410 includes an array of dummy pattern elements 420. Each of the dummy pattern elements 420 may generally be of uniform size and shape. Further, the dummy pattern elements 420 may be nominally arranged in a grid-like pattern. As further shown in FIG. 4A, not only do the horizontal pitches between the dummy pattern elements 420 vary throughout the dummy pattern 410, but the vertical pitches between the dummy pattern elements 420 vary throughout the dummy pattern 410. According to some embodiments, the horizontal pitches vary in a horizontal pitch distribution about a nominal horizontal pitch. In some embodiments the horizontal pitch distribution may vary in a range of plus or minus five percent of the nominal horizontal pitch about the nominal horizontal pitch, vary in a range of plus or minus ten percent of the nominal horizontal pitch about the nominal horizontal pitch, or even vary in excess of ten percent of the nominal horizontal pitch about the nominal horizontal pitch. According to some embodiments, the vertical pitches vary in a vertical pitch distribution about a vertical horizontal pitch. In some embodiments the vertical pitch distribution may vary in a range of plus or minus five percent of the nominal vertical pitch about the nominal vertical pitch, vary in a range of plus or minus ten percent of the nominal vertical pitch about the nominal vertical pitch, or even vary in excess of ten percent of the nominal vertical pitch about the nominal vertical pitch.

Figure 4B:
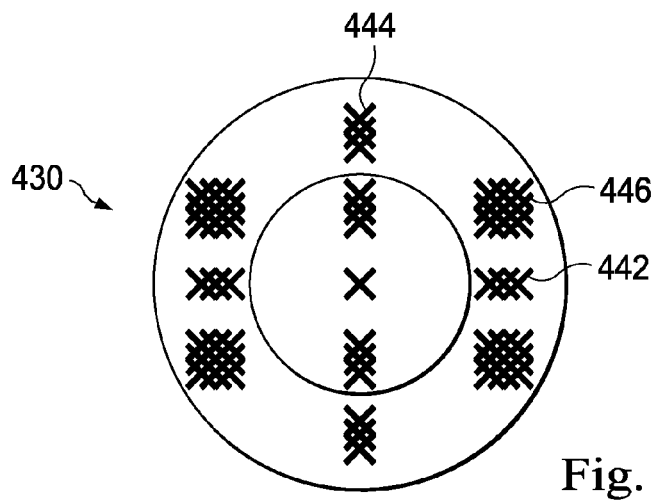
FIG. 4B is a simplified diagram showing the top view of a diffraction spectrum generated by the dummy pattern according to certain embodiments of the present invention.

FIG. 4B is a simplified diagram showing the top view of a diffraction spectrum 430 generated by the dummy pattern 410 according to certain embodiments of the present invention. As shown in FIG. 4B, the use of different horizontal and vertical pitches throughout the dummy pattern 410 generates a diffraction spectrum 430 different from that of FIGS. 2B and 3B. The use of the different horizontal pitches results in less uniformity among the horizontal diffraction orders with the result being that the hot spots 442 and 446 located away from the vertical center line of the diffraction spectrum 430 have reduced concentrations of light and are consequently diffused over a larger area. The use of the different vertical pitches results in less uniformity among the vertical diffraction orders with the result being that the hot spots 444 and 446 located away from the horizontal center line of the diffraction spectrum 430 have reduced concentrations of light and/or are diffused over a larger area. The effect is even more pronounced in the hot spots 446 located away from both the horizontal and vertical center lines of the diffraction spectrum 430 where the hot spots 446 are diffused in both the horizontal and vertical directions.

Because of the variations in the horizontal pitches and vertical pitches, the horizontal and vertical diffraction orders are less uniform and the light rays that result from use of the dummy pattern 410 are concentrated over an even more diffuse range of angles as compared to the embodiment of FIG. 3C. This results in even weaker concentrations of light within the lens system in the hot spots located away from the centerline of the lens system. As a consequence, the lens heating effect may be even further reduced which may result in a further increased lifetime for the lens system and the imaging system. In some embodiments, the use of the dummy pattern 410 may also further improve the resulting image quality.

Figure 5:
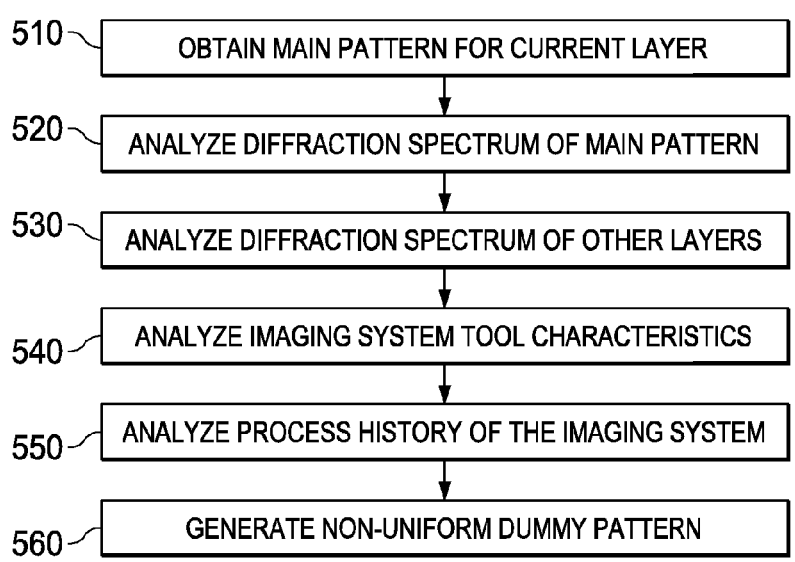
FIG. 5 is a simplified diagram showing a method of creating photolithography masks including dummy patterns with diffused diffraction spectra according to some embodiments of the present invention.

FIG. 5 is a simplified diagram showing a method 500 of creating photolithography masks including dummy patterns with diffused diffraction spectra according to some embodiments of the present invention. As shown in FIG. 5, the method 500 includes a process 510 for obtaining a main pattern for the current layer, a process 520 for analyzing the diffraction spectrum of the main pattern, a process 530 for analyzing the diffraction spectrum of other layers, a process 540 for analyzing the characteristics of the imaging system, a process 550 for analyzing the process history of the imaging system, and a process 560 for generating a non-uniform dummy pattern. According to certain embodiments, the method 500 of creating photolithography masks including dummy patterns with diffused diffraction spectra can be performed using variations among the processes 510-560 as would be recognized by one of ordinary skill in the art. For example, in some embodiments, one or more of the processes 520-550 are optional and may be omitted.

At the process 510, the main pattern for the current layer is obtained. The main pattern includes the shape, size, and location of various main pattern elements. For example, the main pattern elements may be similar to the main pattern elements 110 as shown in FIG. 1A. The shape, size, and location of the main pattern elements define the general regions where it might be desirable to insert one or more dummy pattern elements as described with respect to FIGS. 1A-1C.

At the optional process 520, the diffraction spectrum of the main pattern is analyzed. Depending upon the nature of the main pattern, the main pattern may generate its own pattern of diffraction orders and corresponding hot spots. For example, the main pattern may include several main pattern elements that are of uniform size, shape, and spacing (e.g., in a region including an array of memory cells). The presence of these uniform main pattern elements will generate a corresponding diffraction spectrum with regions of high intensity that correspond to undesirable, but possibly unavoidable main pattern hot spots. By analyzing the diffraction pattern of the main pattern, these hot spots can be mapped so that a dummy pattern can be generated that reduces or avoids creating dummy pattern hot spots in or near the areas associated with the main pattern hot spots. By taking this into account, the overall diffraction spectrum may be more diffuse and result in a reduction in an intensity from using the resulting mask. This will help reduce avoidable wear on the imaging system and may increase its lifetime.

At the optional process 530, the diffraction spectrum of other layers is analyzed. Because the same imaging system is likely to be used multiple times with the masks for other layers in a device, the diffraction spectrum of these masks can be analyzed. The diffraction spectrum associated with the main pattern and dummy pattern elements, if any, of each of these masks is considered to determine if there are any additional areas where dummy pattern hot spots should be avoided or minimized. These areas to avoid can be combined with the areas to avoid identified by process 520 to generate a composite map so that a dummy pattern can be generated that reduces or avoids creating dummy pattern hot spots in or near the areas to avoid in the composite map. By taking this into account, the composite diffraction spectrum intensity that the imaging system is subjected to may be further diffused. This will help reduce avoidable wear on the imaging system and may increase its lifetime.

At the optional process 540, the imaging system tool characteristics are analyzed. Each imaging system is different, and based on the lenses and other imaging equipment used, each tool may have regions with poorer imaging capability and/or may be more susceptible to the lens heating effect. The tool characteristics are analyzed to determine if there are any areas within the imaging tool where dummy pattern hot spots should be avoided or minimized. These areas to avoid can be combined with the areas to avoid identified by process 520 and/or process 530 to generate a composite map so that a dummy pattern can be generated that reduces or avoids creating hot spots in or near the areas to avoid in the composite map. By taking this into account, the composite diffraction spectrum intensity that the imaging system is subjected to may be further diffused. This will help reduce avoidable wear on the imaging system and may increase its lifetime.

At the optional process 550, the process history of the imaging system is analyzed. Because the same imaging system is likely to be used multiple times with the masks for other devices, the diffraction spectrum of these masks can be analyzed. The diffraction spectrum associated with the main pattern and dummy pattern elements, if any, of each of these masks is considered to determine if there are any additional areas where dummy pattern hot spots should be avoided or minimized. The number of times each of these masks has been used over the preceding several months and/or may be used in the following months is also analyzed. Masks that have been and/or will be used more times may result in added stress to the imaging system as the hot spots of those masks are repeatedly generated. The location of these hot spots and the number of repetitions may be analyzed to identify further areas to avoid and these areas to avoid can be combined with the areas to avoid identified by process 520, process 530, and/or process 540 to generate a composite map so that a dummy pattern can be generated that reduces, diffuses, or avoids creating hot spots in or near the areas to avoid in the composite map. By taking this into account, the composite diffraction spectrum intensity that the imaging system is subjected to may be further diffused. This will help reduce avoidable wear on the imaging system and may increase its lifetime.

At the process 560, a non-uniform dummy pattern is generated. The non-uniform dummy pattern is generated to fill the regions between the main pattern elements identified in the process 510. A non-uniform dummy pattern is used to reduce the intensity of and/or diffuse any hot spots generated through use of the dummy pattern. According to some embodiments, the dummy pattern is generated by varying the pitch of the dummy pattern elements in a fashion consistent with FIG. 3A, and/or 4A. The dummy pattern is then merged with the main pattern elements to form a mask in a fashion similar to that shown in FIG. 1C. In some embodiments where the optional processes 520, 530, 540, and 550 are omitted, the dummy pattern may be generated by randomly varying the pitch of the dummy pattern elements. For example, a random distribution of pitch based on a normal, uniform, or other statistical distribution may be used to set the horizontal and/or vertical pitch between adjacent dummy pattern elements. In some embodiments, dummy patterns are used that are based on templates that have a known diffraction spectrum. In some embodiments, the templates are chosen to avoid placing hot spots in the areas to avoid that are identified in the composite map generated during the processes 520, 530, 540, and/or 550.

Figure 6A:
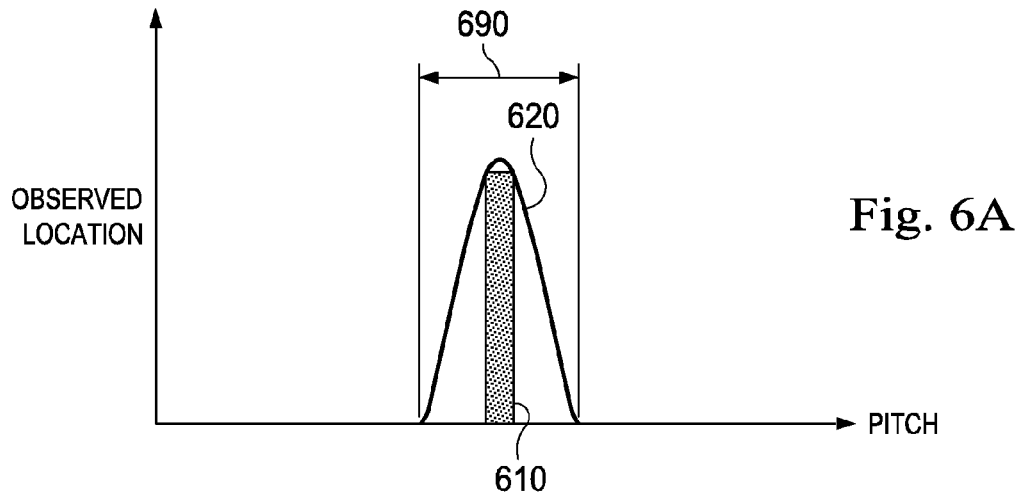
FIG. 6A is a simplified diagram of an observed location of a feature on a substrate created using an ideal uniform dummy pattern.

FIG. 6A is a simplified diagram of an observed location of a feature on a substrate created using an ideal uniform dummy pattern 210. Metrology tools are routinely used in semiconductor fabrication processes for quality assurance and other purposes. One goal of the metrology tool is to observe the location of features that are formed on a substrate. These observations are often challenging as the measurement deviation of the metrology tool often has a magnitude that is very similar to the size of the feature being observed. This problem is further exacerbated with the features formed as a result of a dummy pattern. As described above with respect to FIGS. 2A-2C, the hot spots 240 are concentrated when a dummy pattern 210 with uniform pitches is used. FIG. 6A depicts this problem when an ideal uniform pitch distribution 610 is used. Because the pitch distribution 610 is ideally uniform, there is no variation in the pitch and the resulting hot spots are highly concentrated in areas that may be smaller than a measurement deviation 690 of a metrology tool. When this is the case, the metrology tool cannot accurately locate the resulting feature and can only place it within a region 620 that only approximately locates the feature.

Figure 6B:
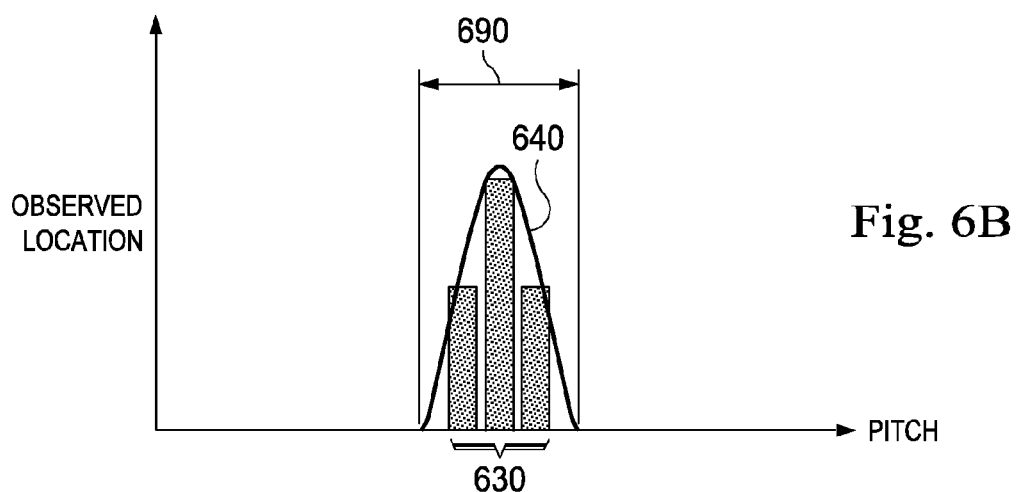
FIG. 6B is a simplified diagram of an observed location of a feature on a substrate created using a non-ideal uniform dummy pattern.

FIG. 6B is a simplified diagram of an observed location of a feature on a substrate created using a non-ideal uniform dummy pattern 210. As shown in FIG. 6B, because the dummy pattern 210 is non-ideal, it may include small variations in its horizontal and/or vertical pitches 630, and there will be some diffusion in the hot spots. Only when the range of the pitch distribution 630 approaches that of the measurement deviation 690 is the metrology tool able to better locate 640 the resulting feature because the corresponding hot spot is diffuse enough to generate a feature approximately the same size as the measurement deviation 690.

Figure 6C:
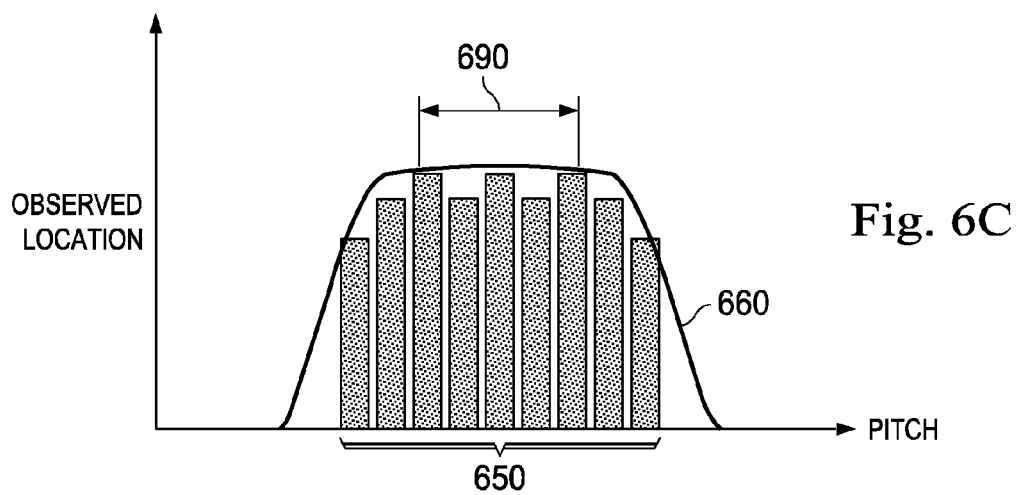
FIG. 6C is a simplified diagram of observed locations of a feature on a substrate created using non-uniform dummy patterns according to some embodiments of the present invention.

FIG. 6C is a simplified diagram of an observed location of a feature on a substrate created using the non-uniform dummy pattern 310 or 410 according to some embodiments of the present invention. As shown in FIG. 6C, the non-uniform dummy pattern 310 or 410 includes horizontal and/or vertical pitches that are distributed over a wide range of values 650. When the range of this pitch distribution 650 exceeds that of the measurement deviation 690, the metrology tool is able to accurately locate 660 the resulting feature because the corresponding hot spot is diffuse enough to generate a feature that is larger in size than the measurement deviation 690. Consequently, the resulting feature is accurately observable by the metrology tool.

Those skilled in the art should appreciate that the embodiments so disclosed are also applicable to imaging system technologies other than the transmissive system where light is shown through a mask as, for example, shown in FIG. 3C. In some embodiments, a reflective mask with reflective main pattern elements and reflective dummy elements may be used. Light is shined on the reflective mask, rather than thru it, and the corresponding diffraction spectrum is controlled to reduce the intensity of and/or diffuse the diffraction spectrum hot spots in the reflected light. For example, such a system is consistent with an extreme ultraviolet (EUV) photolithography technology.

According to certain embodiments, a method for forming a photolithography mask includes receiving a layout of an integrated circuit including one or more main pattern elements, inserting an array of dummy pattern elements interposed between and around the one or more main pattern elements, analyzing a diffraction spectrum of at least one of the one or more main pattern elements and the array of dummy pattern elements, and varying one or more selected from a group consisting of a first direction pitch between corresponding features of dummy pattern elements from the array of dummy pattern elements which are adjacent to each other in a first direction and a second direction pitch between corresponding features of dummy pattern elements from the array of dummy pattern elements which are adjacent to each other in a second direction based on the analyzed diffraction spectrum to form a modified array of dummy pattern elements. The diffraction spectrum of the modified array of dummy pattern elements and the one or more main pattern elements is more diffuse relative to a corresponding diffraction spectrum of a corresponding array of dummy pattern elements in which none of the first direction pitch and the second direction pitch are varied and the one or more main pattern elements.

In some embodiments, the method further includes forming a photolithography mask including the modified array of dummy pattern elements and the one or more main pattern elements. In some embodiments, the method further includes analyzing one or more other mask diffraction spectra of other masks used to form other layers in the integrated circuit and varying one or more selected from a group consisting of the first direction pitch and the section pitch is further based on the analyzed one or more other mask diffraction spectra. In some embodiments, the method further includes analyzing one or more characteristics of an imaging system used in a photolithography process and varying one or more selected from a group consisting of the first direction pitch and the section pitch is further based on the analyzed one or more characteristics of the imaging system. In some embodiments, the method further includes analyzing a process history of an imaging system used in a photolithography process and varying one or more selected from a group consisting of the first direction pitch and the section pitch is further based on the analyzed process history of the imaging system.

In some embodiments, the method further includes selecting a dummy pattern template based on a predetermined diffraction spectrum of the dummy pattern template and forming the modified array of dummy pattern elements using the dummy pattern template. In some embodiments, the first direction is orthogonal to the second direction. In some embodiments, varying the first direction pitch includes varying the first direction pitch in a distribution about a nominal first direction pitch. In some embodiments, the distribution varies by at least plus or minus five percent about the nominal first direction pitch. In some embodiments, the distribution varies by at least plus or minus ten percent about the nominal first direction pitch. In some embodiments, the distribution is random. In some embodiments, the distribution is based on a statistical distribution.

According to certain embodiments, a photolithography mask includes one or more main pattern elements and an array of dummy pattern elements interposed between and around the one or more main pattern elements. The array of dummy pattern elements is formed by varying one or more selected from a group consisting of a first direction pitch between corresponding features of dummy pattern elements from the array of dummy pattern elements which are adjacent to each other in a first direction and a second direction pitch between corresponding features of dummy pattern elements from the array of dummy pattern elements which are adjacent to each other in a second direction. The diffraction spectrum of the array of dummy pattern elements and the one or more main pattern elements is more diffuse relative to a corresponding diffraction spectrum of a corresponding array of dummy pattern elements in which none of the first direction pitch and the second direction pitch are varied and the one or more main pattern elements. The first direction pitch varies in a first distribution about a nominal first direction pitch. The second direction pitch varies in a second distribution about a nominal second direction pitch.

In some embodiments, the first direction is orthogonal to the second direction. In some embodiments, the first distribution varies by at least plus or minus five percent about the nominal first direction pitch. In some embodiments, the first distribution varies by at least plus or minus ten percent about the nominal first direction pitch. In some embodiments, the first distribution is based on a statistical distribution. In some embodiments, the first distribution and the second distribution are different. In some embodiments, the first distribution and the second distribution are the same.

According to certain embodiments, a semiconductor device includes one or more observable dummy features, the dummy features being formed using a photolithography mask. The photolithography mask includes one or more main pattern elements and an array of dummy pattern elements interposed between and around the one or more main pattern elements. The array of dummy pattern elements is formed by varying one or more selected from a group consisting of a first direction pitch between corresponding features of dummy pattern elements from the array of dummy pattern elements which are adjacent to each other in a first direction and a second direction pitch between corresponding features of dummy pattern elements from the array of dummy pattern elements which are adjacent to each other in a second direction. The diffraction spectrum of the array of dummy pattern elements and the one or more main pattern elements is more diffuse relative to a corresponding diffraction spectrum of a corresponding array of dummy pattern elements in which none of the first direction pitch and the second direction pitch are varied and the one or more main pattern elements. The first direction pitch varies in a first distribution about a nominal first direction pitch. The second direction pitch varies in a second distribution about a nominal second direction pitch. At least one of the first distribution or the second distribution is greater than a measurement deviation of a metrology tool used to observe the semiconductor device.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photolithography mask, the method comprising:
   receiving a layout of an integrated circuit including one or more main pattern elements;
   inserting an array of dummy pattern elements interposed between and the around one or more main pattern elements;
   analyzing a diffraction spectrum of at least one of the one or more main pattern elements and the array of dummy pattern elements; and
   varying one or more selected from a group consisting of a first direction pitch between corresponding features of dummy pattern elements from the array of dummy pattern elements which are adjacent to each other in a first direction and a second direction pitch between corresponding features of dummy pattern elements from the array of dummy pattern elements which are adjacent to each other in a second direction based on the analyzed diffraction spectrum to form a modified array of dummy pattern elements;
   wherein the diffraction spectrum of the modified array of dummy pattern elements and the one or more main pattern elements is more diffuse relative to a corresponding diffraction spectrum of a corresponding array of dummy pattern elements in which none of the first direction pitch and the second direction pitch are varied and the one or more main pattern elements.

2. The method of claim 1, further comprising forming a photolithography mask including the modified array of dummy pattern elements and the one or more main pattern elements.

3. The method of claim 1, further comprising:
   analyzing one or more other mask diffraction spectra of other masks used to form other layers in the integrated circuit; and
   varying one or more selected from a group consisting of the first direction pitch and the section pitch is further based on the analyzed one or more other mask diffraction spectra.

4. The method of claim 1, further comprising:
analyzing one or more characteristics of an imaging system used in a photolithography process; and
varying one or more selected from a group consisting of the first direction pitch and the section pitch is further based on the analyzed one or more characteristics of the imaging system.

5. The method of claim 1, further comprising:
analyzing a process history of an imaging system used in a photolithography process; and
varying one or more selected from a group consisting of the first direction pitch and the section pitch is further based on the analyzed process history of the imaging system.

6. The method of claim 1, further comprising:
selecting a dummy pattern template based on a predetermined diffraction spectrum of the dummy pattern template; and
forming the modified array of dummy pattern elements using the dummy pattern template.

7. The method of claim 1 wherein the first direction is orthogonal to the second direction.

8. The method of claim 1 wherein varying the first direction pitch comprises varying the first direction pitch in a distribution about a nominal first direction pitch.

9. The method of claim 8 wherein the distribution varies by at least plus or minus five percent about the nominal first direction pitch.

10. The method of claim 8 wherein the distribution varies by at least plus or minus ten percent about the nominal first direction pitch.

11. The method of claim 8 wherein the distribution is random.

12. The method of claim 8 wherein the distribution is based on a statistical distribution.

13. A photolithography mask comprising:
one or more main pattern elements; and
an array of dummy pattern elements interposed between and around the one or more main pattern elements;
wherein:
the array of dummy pattern elements is formed by varying one or more selected from a group consisting of a first direction pitch between corresponding features of dummy pattern elements from the array of dummy pattern elements which are adjacent to each other in a first direction and a second direction pitch between corresponding features of dummy pattern elements from the array of dummy pattern elements which are adjacent to each other in a second direction;
the diffraction spectrum of the array of dummy pattern elements and the one or more main pattern elements is more diffuse relative to a corresponding diffraction spectrum of a corresponding array of dummy pattern elements in which none of the first direction pitch and the second direction pitch are varied and the one or more main pattern elements;
the first direction pitch varies in a first distribution about a nominal first direction pitch; and
the second direction pitch varies in a second distribution about a nominal second direction pitch.

14. The photolithography mask of claim 13 wherein the first direction is orthogonal to the second direction.

15. The photolithography mask of claim 13 wherein the first distribution varies by at least plus or minus five percent about the nominal first direction pitch.

16. The photolithography mask of claim 13 wherein the first distribution varies by at least plus or minus ten percent about the nominal first direction pitch.

17. The photolithography mask of claim 13 wherein the first distribution is based on a statistical distribution.

18. The photolithography mask of claim 13 wherein the first distribution and the second distribution are different.

19. The photolithography mask of claim 13 wherein the first distribution and the second distribution are the same.

20. A semiconductor device, the device comprising:
one or more observable dummy features, the dummy features being formed using a photolithography mask including:
one or more main pattern elements; and
an array of dummy pattern elements interposed between and around the one or more main pattern elements;
wherein:
the array of dummy pattern elements is formed by varying one or more selected from a group consisting of a first direction pitch between corresponding features of dummy pattern elements from the array of dummy pattern elements which are adjacent to each other in a first direction and a second direction pitch between corresponding features of dummy pattern elements from the array of dummy pattern elements which are adjacent to each other in a second direction;
the diffraction spectrum of the array of dummy pattern elements and the one or more main pattern elements is more diffuse relative to a corresponding diffraction spectrum of a corresponding array of dummy pattern elements in which none of the first direction pitch and the second direction pitch are varied and the one or more main pattern elements;
the first direction pitch varies in a first distribution about a nominal first direction pitch;
the second direction pitch varies in a second distribution about a nominal second direction pitch; and
at least one of the first distribution or the second distribution is greater than a measurement deviation of a metrology tool used to observe the semiconductor device.

* * * * *